(12) United States Patent
Kato

(10) Patent No.: US 12,029,017 B2
(45) Date of Patent: Jul. 2, 2024

(54) SEMICONDUCTOR MODULE, POWER CONVERSION DEVICE, AND MANUFACTURING METHOD OF SEMICONDUCTOR MODULE

(71) Applicant: FUJI ELECTRIC CO., LTD., Kawasaki (JP)

(72) Inventor: Ryoichi Kato, Matsumoto (JP)

(73) Assignee: FUJI ELECTRIC CO., Ltd., Kawasaki (JP)

( * ) Notice: Subject to any disclaimer, the term of this patent is extended or adjusted under 35 U.S.C. 154(b) by 378 days.

(21) Appl. No.: 17/365,053

(22) Filed: Jul. 1, 2021

(65) Prior Publication Data

US 2022/0022340 A1 Jan. 20, 2022

(30) Foreign Application Priority Data

Jul. 14, 2020 (JP) .................................. 2020-120968

(51) Int. Cl.
*H01L 23/42* (2006.01)
*H05K 7/20* (2006.01)

(52) U.S. Cl.
CPC ............. *H05K 7/209* (2013.01); *H01L 23/42* (2013.01)

(58) Field of Classification Search
None
See application file for complete search history.

(56) References Cited

U.S. PATENT DOCUMENTS

| | | | | |
|---|---|---|---|---|
| 8,564,114 | B1 * | 10/2013 | Lanzone | H01L 23/42 257/276 |
| 9,502,269 | B2 * | 11/2016 | Berard | H01L 21/50 |
| 2006/0238984 | A1 * | 10/2006 | Belady | H01L 23/42 257/E23.098 |
| 2009/0200065 | A1 * | 8/2009 | Otoshi | H05K 3/341 174/252 |
| 2012/0098119 | A1 * | 4/2012 | Refai-Ahmed | H01L 25/115 438/109 |
| 2013/0135824 | A1 * | 5/2013 | Harubeppu | H01L 23/42 361/709 |
| 2016/0005671 | A1 * | 1/2016 | Tsuyuno | H01L 23/24 257/789 |
| 2016/0111345 | A1 * | 4/2016 | Kawase | H01L 23/3675 257/706 |
| 2019/0206751 | A1 * | 7/2019 | Harada | H01L 25/07 |
| 2021/0082781 | A1 * | 3/2021 | Yamada | H01L 23/4924 |

FOREIGN PATENT DOCUMENTS

| | | |
|---|---|---|
| JP | 2012-004468 A | 1/2012 |
| JP | 2013-251473 A | 12/2013 |
| JP | 5383599 B2 | 1/2014 |

OTHER PUBLICATIONS

"Overview of materials for Epoxy Cure Resin" (Year: 2023).*

* cited by examiner

*Primary Examiner* — Evren Seven
(74) *Attorney, Agent, or Firm* — HAUPTMAN HAM, LLP

(57) ABSTRACT

A semiconductor module has a heat conduction section provided between a multilayer substrate, on which semiconductor chips are mounted, and a cooler. The heat conduction section includes a frame and an opening, and the opening has a grease portion which is provided partly in the opening and is in contact with the multilayer substrate and the cooler, and a space portion which is provided between the grease portion and the frame in a partial and band-shaped manner.

13 Claims, 6 Drawing Sheets

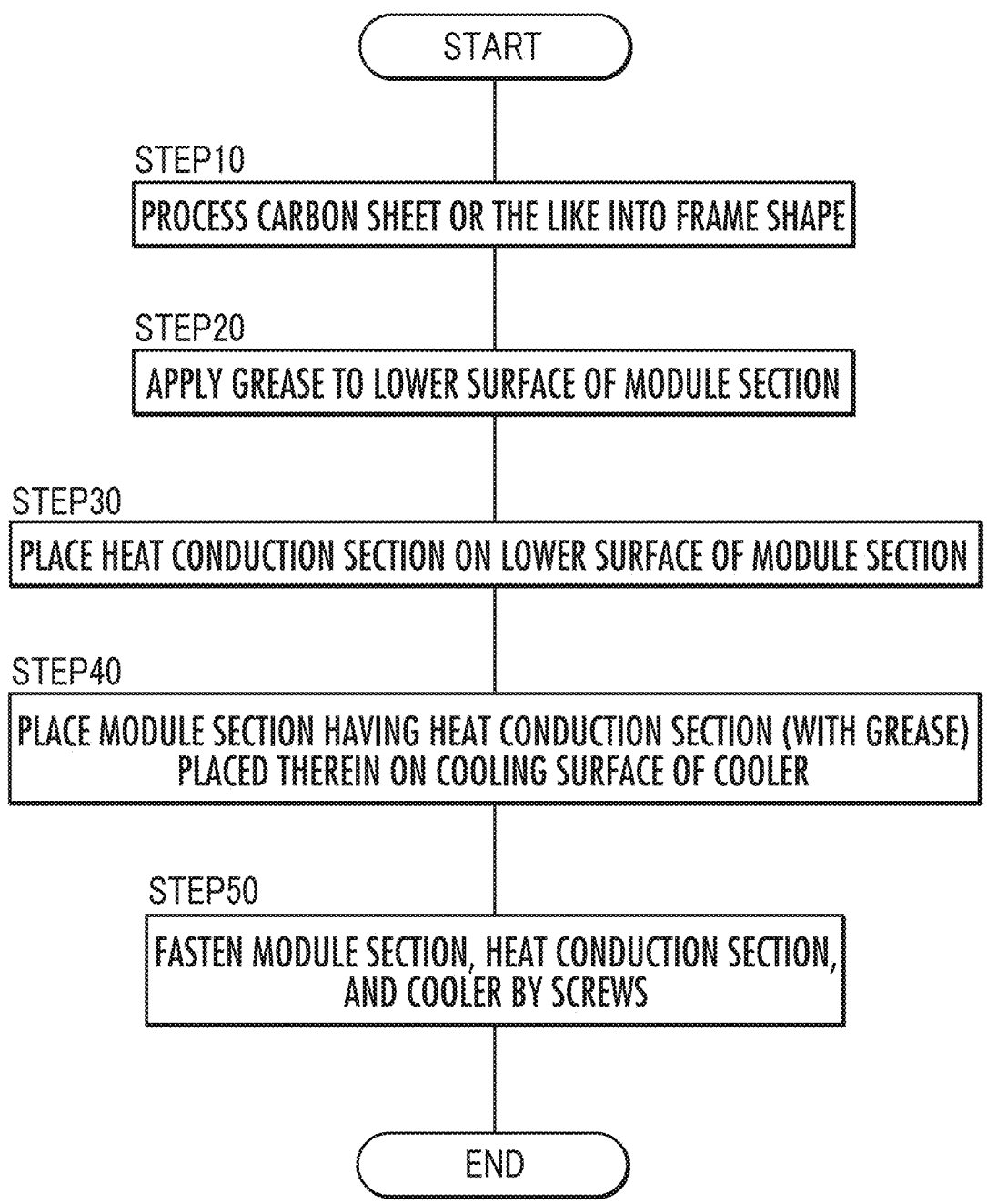

SEMICONDUCTOR MODULE, POWER CONVERSION DEVICE, AND MANUFACTURING METHOD OF SEMICONDUCTOR MODULE

RELATED APPLICATIONS

The present application is based on, and claims priority from, Japanese Application No. 2020-120968 filed Jul. 14, 2020, the disclosure of which is hereby incorporated by reference herein in its entirety.

BACKGROUND OF TH INVENTION

1. Field of the Invention

The present invention relates to a semiconductor module having a heat conducting layer that connects a semiconductor circuit hoard and a cooler thereof, a power conversion device including the semiconductor module, and a manufacturing method of the semiconductor module.

2. Description of the Related Art

There are cases where a power semiconductor or the like used as a switching device for power conversion is adversely affected by heat generated from a semiconductor chip. In order to suppress this, a heat conducting layer, a cooler, and the like for heat dissipation are used in a power semiconductor module having a power semiconductor.

For example, the heat generated during the operation of a power semiconductor of a power semiconductor device is transferred to a cooler (radiating fin) through a heat conducting layer between a semiconductor module and the cooler to cool the heated power semiconductor device.

If a heat conducting layer is not provided, then an air layer with low thermal conductivity may inconveniently be formed due to the warpage or unevenness of the contact surface between the semiconductor module and the cooler, thus preventing the dissipation of the heat generated at chips. Therefore, a heat conducting layer of grease or the like in a semisolid form or the like is usually used. However, there are cases where, as an operating temperature Tjmax rises, thermal resistance increases due to occurrence of grease outflow or e like (pump out) during $\Delta TjP/C$ and $\Delta TcP/C$ tests.

Patent Document 1 given below discloses a highly viscous grease that is adapted to be easy to apply at the time of application and is less likely to be pumped out during a reliability test and in the actual use by changing the viscosity at the time of applying the grease and after the application.

Patent Document 1: Japanese Patent No. 5383599

However, there is a problem that a step of mixing toluene or the like at the time of application and a step of evaporation after the application are additionally required, so that the number of steps increases, leading to higher cost. Further, it is said that pump-out can be suppressed by setting the yield value of grease viscosity at 20° C. to 40 Pa or more and 300 Pa or less, but the temperature to which grease is exposed changes depending on the size of a circuit board or an operating environment. Thus, it is necessary to optimize the grease viscosity according to circumstances.

SUMMARY OF THE INVENTION

The present invention has been made in view of the aforesaid problems, and an object of the invention is to provide a semiconductor module which suppresses the outflow (pump-out) or the like of grease and exhibits high heat dissipation performance, and a manufacturing method of the same.

To this end, a first aspect of the invention is a semiconductor module which is composed of a multilayer substrate provided with a semiconductor device and a cooler that cools the multilayer substrate, and includes a heat conduction section provided between the multilayer substrate and the cooler, wherein the heat conduction section includes a frame and an opening, and the opening has a grease portion which is provided partly in the opening and fills in between the multilayer substrate and the cooler, and a space portion provided between the grease portion and the frame in a partial and band-shaped manner.

In the semiconductor module according to the present invention, the heat conduction section is provided between the multilayer substrate and the cooler, and the heat generated in the semiconductor device is conducted to the cooler through the heat conduction section. The heat conduction section includes the frame and the opening, and the opening has the grease portion provided partly in the opening. The grease portion fills in between the multilayer substrate and the cooler to expedite heat dissipation.

The semiconductor module is frequently installed in parallel to a gravity direction when mounted in, for example, an inverter. Further, the grease of the grease portion is semisolid, so that the outflow or pump-out phenomenon of the grease occurs due to gravity. To prevent such a phenomenon, the band-shaped space portion is provided between the grease portion and the frame so as to accommodate grease that has moved. This enables the semiconductor module in accordance with the present invention to maintain high heat dissipation performance while preventing the outflow or pump-out phenomenon of grease.

In the semiconductor module according to the first aspect of the invention, preferably, the opening has two opposing sides, and the space portion is in contact with one of the two sides and is provided from one end to the other end of the one side.

The opening of the frame is, for example, rectangular, and has two opposing sides. The space portion is in contact with one of the two sides and is provided uninterruptedly from one end of the one side to the other thereof (from end to end). The semiconductor module in accordance with the present invention has the predetermined band-shaped space that accommodates grease, thus making it possible to prevent the grease from flowing out.

Further, in the semiconductor module according to the first aspect of the invention, the semiconductor device is preferably placed so as to be separated from the end of the grease portion adjacent to the space portion toward the center of the grease portion when viewed from above.

When viewed from above, the semiconductor device is placed apart from the end of the grease portion toward the center of the grease portion, and therefore does not overlap with the space portion. In other words, the semiconductor device overlaps with the grease portion when viewed from above, thus enabling efficient heat dissipation of the semiconductor device (the multilayer substrate).

Further, in the semiconductor module according to the first aspect of the invention, the space portion preferably occupies an area of 5 to 10% of the opening.

According to this configuration, the space portion of the heat conduction section can secure a sufficient space for accommodating grease that has moved.

Further, in the semiconductor module according to the first aspect of the invention, the heat conduction section preferably has a frame provided with a comb-shaped portion protruding toward the grease portion from a peripheral edge of the opening on a side where the space portion is provided.

According to this configuration, the comb-shaped portion of the frame protrudes toward the grease portion from the peripheral edge of the opening on a side where the space portion is provided. This causes grease that has been compressed, pressed and spread to move along the comb-shaped portion, so that the grease is made uniform, thus making the grease less likely to flow out.

Further, in the semiconductor module according to the first aspect of the invention, a Young's modulus Y1 of the frame is preferably higher than a Young's modulus Y2 of the grease portion.

According to this configuration, the frame is preferably composed of a material, such as a carbon sheet, which has a high Young's modulus Y1 and high thermal conductivity. Further, the grease portion may use grease, the Young's modulus Y2 of which is lower than that of the frame and which has high thermal conductivity and fluidity.

Further, in the semiconductor module according to the first aspect of the invention, the Young's modulus Y1 preferably satisfies a condition of 5 GPa≤Y1≤15 GPa, and the Young's modulus Y2 preferably satisfies a condition of 1 Pa≤Y2≤200 Pa.

By using a material that satisfies the of conditions, when the heat conduction section is pressed and deformed or a circuit board is warped, the heat conduction section can reliably conduct the heat generated in the circuit board to a cooler by adapting to such deformation or warpage.

Further, in the semiconductor module according to the first aspect of the invention, viscosity G of the grease portion preferably satisfies a condition of 60 Pa·s≤G≤500 Pa·s.

The grease portion satisfies the aforesaid condition, so that when the heat conduction section is pressed and deformed or a circuit board is warped, the heat generated in the circuit board can be reliably conducted to the cooler by adapting to such deformation or warpage.

A second aspect of the invention is a power conversion device characterized in that any one of the semiconductor modules of the first invention is installed upright such that the space portion is at the top.

According to this configuration, when the semiconductor module is mounted inside a power conversion device, the semiconductor module is installed upright such that the space portion of the frame is at the top. With this arrangement, grease is subjected to a force of sagging down due to gravity, but the grease is accommodated in the space portion, so that the outflow thereof is prevented.

Further, a third aspect of the invention is a manufacturing method of a semiconductor module composed of a multilayer substrate provided with a semiconductor device, and a cooler that cools the multilayer substrate, including at least: a step of fabricating a heat conduction section provided between the multilayer substrate and the cooler; a step of forming a grease portion which is provided partly in an opening of a frame of the heat conduction section and which fills in between the multilayer substrate and the cooler; and a step of forming a space portion provided between the grease portion and the frame in a partial and band-shaped manner.

According to the manufacturing method of a semiconductor module in accordance with the present invention, first, a heat conduction section to be provided between a multilayer substrate and a cooler is fabricated. Thereafter, a grease portion is formed partly in an opening of the heat conduction section. The grease portion fills in between the multilayer substrate and the cooler, thus allowing the heat generated in a semiconductor device to be conducted to the cooler so as to be dissipated.

Further, according to the manufacturing method, a space portion is formed between the grease portion and the frame in a partial and band-shaped manner. Depending on the placement of a semiconductor module, grease flows out or a pump-out phenomenon occurs due to gravity. To prevent this, the space portion is provided in the opening beforehand such that the grease moves to the space portion. This enables the manufactured semiconductor module to prevent the outflow or the pump-out phenomenon of the grease.

BRIEF DESCRIPTION OF THE DRAWINGS

FIG. 4 is a flowchart illustrating a manufacturing method of the semiconductor module;

DESCRIPTION OF THE PREFERRED EMBODIMENTS

Figure 1:
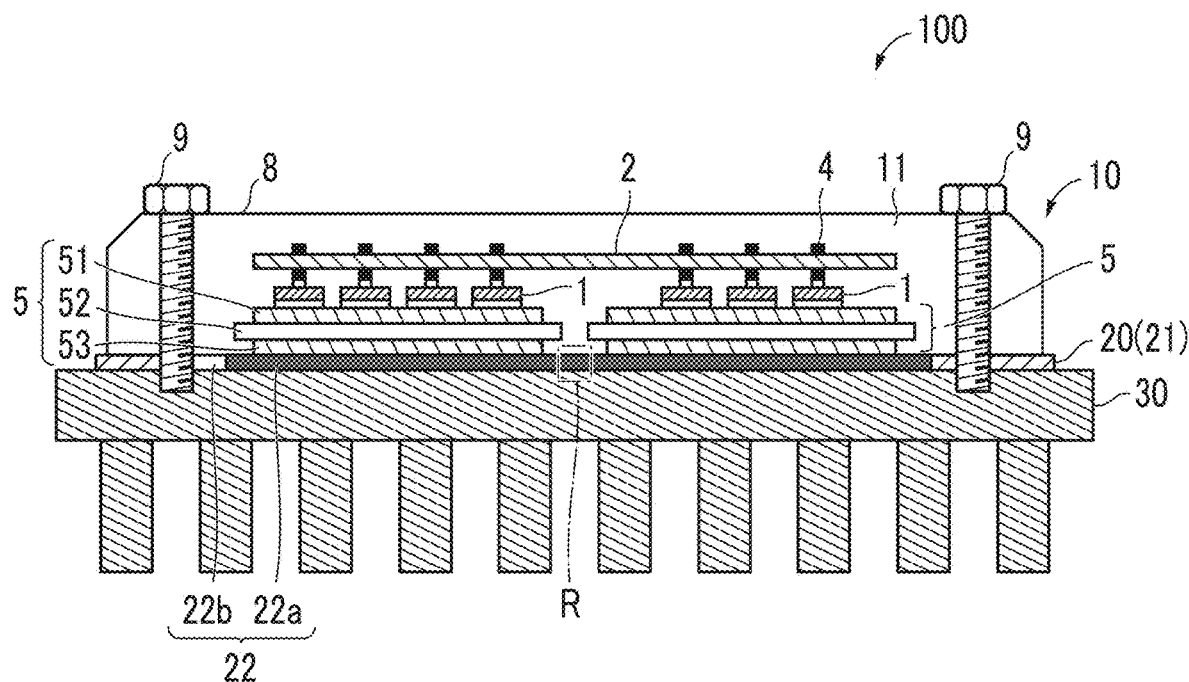
FIG. 1 is a sectional view of a semiconductor module according to an embodiment of the present invention.

The following will describe an embodiment of a semiconductor module in accordance with the present invention with reference to the accompanying drawings. The embodiment can be changed as appropriate and applied in a combination. Further, in the following description and the accompanying drawings, the same reference numerals will be assigned to substantially the same or equivalent components. It should be noted that the present invention is not limited to the embodiment described below.

The following description assumes that a semiconductor module 100 is a power semiconductor module with a power semiconductor device mounted thereon as a semiconductor device. However, the present invention can be applied to semiconductor modules provided with a variety of semiconductor devices.

FIG. 1 is a sectional view of the semiconductor module 100 according to an embodiment of the present invention. The semiconductor module 100 is composed of a module section 10 in which semiconductor chips 1, a wiring board 2, pins 4, and multilayer substrates 5 are placed and sealed by a resin portion 11, a cooler 30 that dissipates heat generated in the module section 10, and a heat conduction section 20 that is placed between the module section 10 and the cooler 30 and conducts the generated heat to the cooler 30.

The semiconductor chips 1 are power chips such as insulated gate bipolar transistors (IGBTs) or diode chips, and various Si devices, SiC devices, GaN devices and the like can be used. Further, a combination of these devices may be also used. For example, a hybrid module or the like using a Si-IGBT and a SiC-SBD can be used. The number of semiconductor chips 1 mounted is not limited to the illustrated form, and a plurality of the semiconductor chips 1 can be mounted.

The wiring board 2 is placed on the upper surface side of the semiconductor chips 1. The wiring board 2 has a structure in which metal foils (metal wiring plates) are formed on both surfaces of an insulating substrate, and the metal foil on the lower surface is formed so as to face the semiconductor chips 1. The wiring board 2 may be a so-called printed wiring board. The insulating substrate preferably uses a material having low dielectric constant and high thermal conductivity, and uses, for example, an insulating resin, or $Si_3N_4$, AlN, or $Al_2O_3$. Further, the metal foils are preferably made of a material having low electrical resistance and high thermal conductivity, such as Cu.

One end of each of the pins 4 is bonded to the upper surface of each of the semiconductor chips 1 by solder, and the other end is used for connection to the wiring board 2 or the like. The pins 4 may be made of a metal having low electrical resistance and high thermal conductivity, such as Cu. The pins 4 may be connected to the wiring board 2 on the upper surface side or connected to a take-out terminal. The pins 4 may alternatively be connected to a lead frame. Further, for the wiring from the upper surface of the semiconductor chips 1, a wire made of a lead frame, Al, or the like other than the pins 4 may be used.

Each of the multilayer substrates 5 is composed of an insulating substrate 52 at the middle, a first electrically conductive plate 51 formed on one surface of the insulating substrate 52, and a second electrically conductive plate 53 formed on the other surface thereof. As the insulating substrate 52, a material having superior electrical insulation and thermal conductivity, such as $Al_2O_3$, AlN, or SiN, can be used. In particular, for high withstand voltage applications, a material having both electrical insulation and thermal conductivity is preferred, and AlN or SiN can be used, but the material is not limited thereto.

For the first electrically conductive plate 51 and the second electrically conductive plate 53, a metal material such as Cu and Al having superior electrical conductivity and workability can be used. In the present specification, the electrically conductive plate facing the semiconductor chips 1 is referred to as the first electrically conductive plate 51, and the electrically conductive plate facing the cooler 30 is referred to as the second electrically conductive plate 53. Further, the second electrically conductive plate 53 may be referred to as a back surface copper foil. Further, Cu or Al that has been subjected to a treatment such as Ni plating may be used for the purpose of anti-corrosion or the like. As the method of placing the electrically conductive plates on the insulating substrates 52, a direct bonding method (the direct copper bonding method) or a brazing material bonding method (the active metal brazing method) is adopted.

As illustrated, the multilayer substrates 5 are placed on the lower surface side of the semiconductor chips 1. The multilayer substrates 5 are electrically isolated from the electrically conductive plates 51 and 53 by the insulating property of the insulating substrates 52. The peripheral edges of the insulating substrates 52 preferably protrude outward beyond the peripheral edges of the electrically conductive plates.

The lower surfaces of the semiconductor chips 1 and the electrically conductive plate (the first electrically conductive plate 51) on the upper surface side of the multilayer substrates 5 are electrically and thermally bonded by solder or the like. Although the upper surfaces of the multilayer substrates 5 and the electrically conductive plate on the lower surfaces thereof are electrically isolated, there is good thermal conductivity between the two electrically conductive plates. Further, the back surface copper foil on the lower surface of each of the multilayer substrates 5 and the outer wall of the cooler 30 are bonded and in contact with each other through the heat conduction section 20.

The module section 10 has a plurality of the semiconductor chips 1, the wiring board 2, the pins 4 and the multilayer substrates 5 in a case 8. These components are resin-sealed (a resin portion 11) in the case 8 by a potting or molding method. Further, the module section 10 is fixed to the cooler 30 by screws 9 from the upper surface side. The surface of the cooler 30 that faces the module section 10 is also referred to as a cooling surface.

The module section 10 sealed by the resin portion 11 is connected to the cooler 30 through the heat conduction section 20. Preferably, the heat conduction section 20 has a frame 21 and an opening 22, and is made of a material having high thermal conductivity. The opening 22 has a grease portion 22a and a space portion 22b, which are provided partly in the opening 22. In the module section 10, the side on which the second electrically conductive plate 53 is exposed is also referred to as the back surface of the module section 10.

The opening 22 needs to have a size that allows at least the second electrically conductive plates 53 to be accommodated, and the grease portion 22a and the space portion 22b to be provided. The opening 22 may be smaller than the area of the multilayer substrates 5.

The frame 21 of the present embodiment preferably has a predetermined Young's modulus (to be described in detail later), and more preferably has high thermal conductivity. The frame 21 of the present embodiment is fabricated by processing a carbon sheet or the like. The carbon sheet is a sheet that is hard and has high thermal conductivity. The thickness of the carbon sheet preferably ranges from approximately 200 μm to approximately 1000 μm, and more preferably ranges from 300 μm to 500 μm from the viewpoint of thermal resistance and rigidity. The thermal conductivity of the carbon sheet is 10 to 40 W/mk, which is higher than that of a soft thermally conductive material such as grease (thermal conductivity: 1 to 4 W/mk).

The carbon sheet is a sheet-like member obtained by compressing a material mainly containing carbon, and may be a graphite sheet or the like. Here, the term "mainly" means that the material contains carbon in 90 wt % or more, excluding unavoidable impurities, and may consist only of carbon. Further, carbon fibers of polyacylonitrile (PAN) type, pitch type or the like, or carbon nanofibers may be solidified into a sheet. At that time, the diameter of the carbon fiber is preferably 5 μm to 10 μm from the viewpoint of denseness, and the diameter of the carbon nanofiber is preferably 1 nm to 50 nm.

Further, a sheet made of only glassy carbon may be used, or a sheet containing a resin in addition to carbon may be used. If a resin is contained, then the carbon content rate is preferably 80 wt % to 99 wt %, and more preferably 90 wt % to 95 wt % from the viewpoint of thermal conductivity and elasticity. If the content rate is lower than this, then the formability is impaired, and if the content is higher than this, then the thermal conductivity is deteriorated, which is undesirable. Further, as the resin, an epoxy resin, a phenol resin, a maleimide resin or the like is used.

The frame 21 of the present embodiment may be made of a material in which a thermally conductive filler other than carbon is blended with the resin. More specifically, the material is obtained by adding thermally conductive inorganic material particles of silica ($SiO_2$), alumina ($Al_2O_3$), silicon nitride (SiN), aluminum nitride (AlN) or the like, or metal particles of Cu, Al, or the like in an amount of 50 wt % to 0 wt % as a filler to a material of epoxy resin, phenol resin, maleimide resin or silicone resin, then the mixture is cured and formed into a frame shape.

The grease (thermal grease) semisolid (fluid) material containing silicone resin, non-silicone resin, acrylic resin or the like as a main component and mixed with particles of insulating silicon nitride (SiN), alumina ($Al_2O_3$) or the like as a thermally conductive filler. The grease portion 22a contacts an area where the semiconductor chips 1 exist and also the cooler 30, so that the heat generated at the semiconductor chips 1 can be conducted to the cooler 30 and dissipated.

Preferably, the grease containing a thermally conductive filler is electrically insulating. This is to prevent the terminals or the like of the module section 10 from being short-circuited by scattered grease. For this reason, the thermally conductive filler is preferably formed of ceramic rather than a metal such as copper, aluminum or the like.

A pasty thermal interface material (TIM) such as a thermally conductive gel may be adopted in place of grease.

The cooler 30 is a radiating fin made of a material having high thermal conductivity, such as Al, Cu or the like. As the cooler 30, a heat radiating fin composed of a plurality of flow paths in which a large number of plate-shaped fins are arranged in parallel may be used, or a metal plate may be used.

The semiconductor module 100 described above is installed in an inverter controller. In this case, the semiconductor module 100 is frequently placed vertically (refer to FIG. 3A). The vertical placement means that the back surface of the semiconductor module 100, i.e., the long or short sides face in the direction of gravity, and the cooling surface of the cooler 30 also faces in the direction of gravity.

Figure 2:
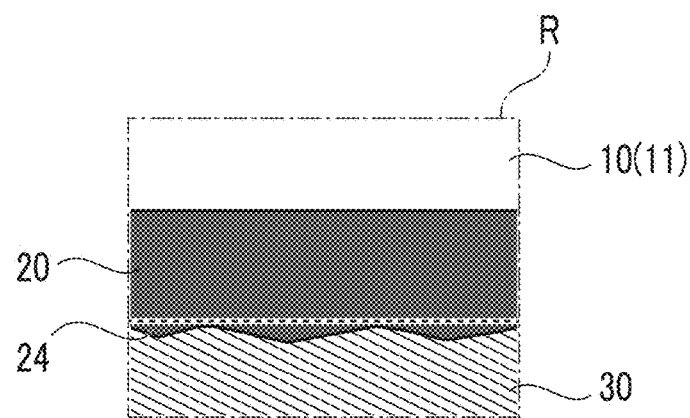
FIG. 2 is a sectional view of a region R of FIG. 1.

FIG. 2 is an enlarged view of a region R of FIG. 1.

The semiconductor module 100 is used for, for example, power conversion. At this time, the semiconductor chips 1 generate heat. Therefore, it is necessary to maintain the temperatures of the semiconductor chips 1 and the multilayer substrates 5 at a certain temperature or lower, and thus the cooler 30 is attached to the back surface of the module section 10 (the resin portion 11).

The surface where the module section 10 and the cooler 30 are in contact with each other is not smooth because of macroscopic warpage, undulation, or the like, and microscopic fine irregularities due to the roughness of the contact surface. In addition, the shape of the surface of the module section 10 that faces the cooler 30 (the back surface of the module section 10) is deformed (warped or undulated, or minutely uneven) due to the thermal expansion of the members caused by the heat generated at the semiconductor chips 1. Consequently, if the heat conduction section 20 is absent between the module section 10 and the cooler 30 and an air layer 24 having a low thermal conductivity is formed, then heat cannot be conducted and the thermal resistance increases. Therefore, the heat conduction section 20 has the grease portion 22a made of semisolid grease that fills in the air layer 24 and adheres well.

Figure 3A:
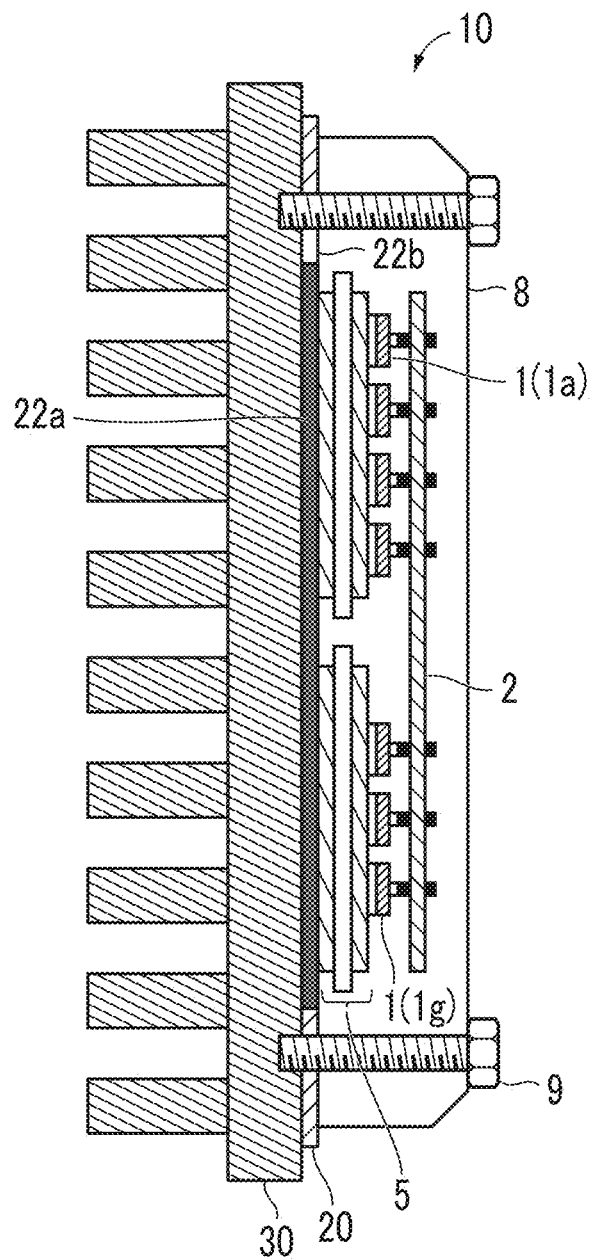
FIG. 3A is a diagram illustrating the actual placement of the semiconductor module.
Figure 3B:
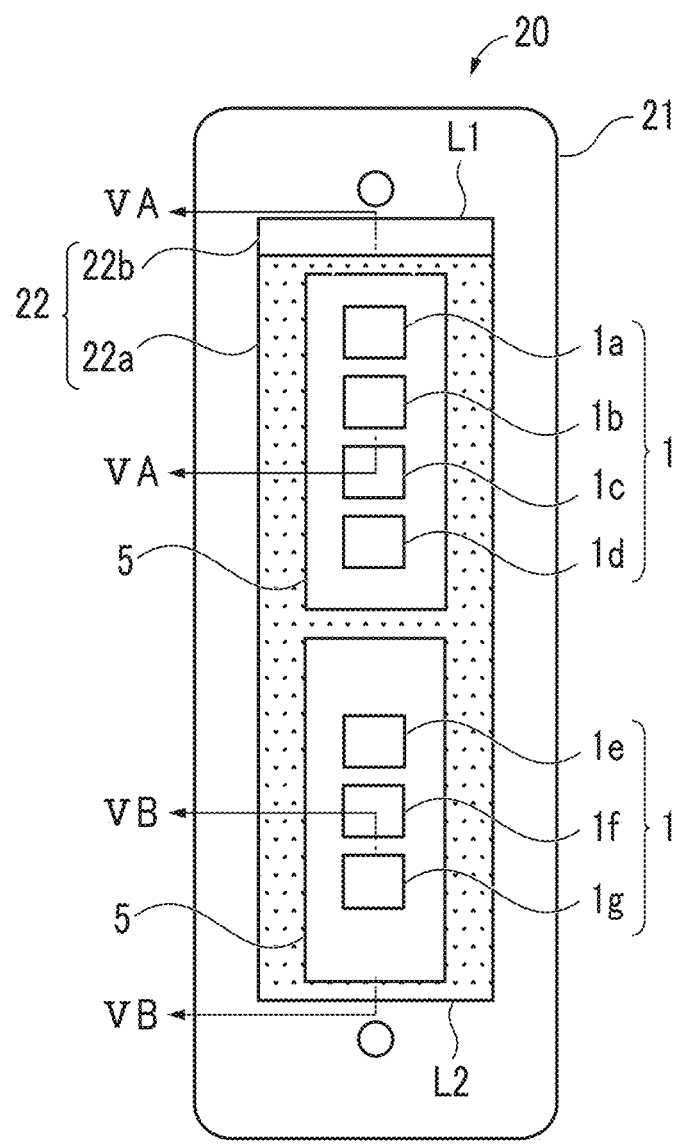
FIG. 3B is a diagram illustrating a heat conduction section of the semiconductor module when viewed from above.

FIG. 3A and FIG. 3B illustrate how the semiconductor module 100 is placed when used.

For example, when the semiconductor module 100 is placed in an inverter, the semiconductor module 100 is vertically placed, as illustrated in FIG. 3A. Consequently, the grease portion 22a of the heat conduction section 20 is subjected to a sagging force due to the influence of gravity. The semiconductor module 100 is subjected to a temperature load during the operation of the inverter, and the module section 10, the temperature of which has risen, deforms, causing the surface thereof facing the cooler 30 to warp. Then, the thermal expansion of the grease and this warpage push the grease outward, thus forming a void (pump-out) in the grease portion 22a.

As a solution, the opening 22 of the heat conduction section 20 is provided beforehand with the space portion 22b in which the grease of the grease portion 22a can move. In particular, if the space portion 22b is provided in a belt shape on the peripheral edge of the end portion of the opening 22 on the side opposite from the direction of gravity (upper side), the lower portion of the opening 22 is sealed, thus making it possible to prevent the outflow of the grease. The "belt shape" includes a rectangular shape, and if the outer edge of the grease portion 22a on the space portion 22b side has a curved shape such as an arc shape or a wavy shape, then a shape corresponding to the outer edge shape is included.

Further, FIG. 3B illustrates an example in which the heat conduction section 20 is seen through from the upper surface side of the semiconductor chips 1 (an example viewed from the left side on the paper surface). As illustrated in the drawing, there are two multilayer substrates 5 on the upper surface side of the grease portion 22a, and semiconductor chips 1a to 1d and semiconductor chips 1e to 1g are placed on the upper surface side of the two multilayer substrates 5. There may be a single or a plurality of the multilayer substrates 5 in the module section 10, and a single or a plurality of the semiconductor chips 1 may be mounted on each of the multilayer substrate 5.

As illustrated in FIG. 3B, the frame 21 of the heat conduction section 20 has a shape that conforms to the shape of the module section 10 and has two opposing sides such as sides L1 and L2 in the lateral direction. The frame 21 is not limited to an oblong shape (rectangular shape) and may have a polygonal shape, but preferably has a shape that is the same as the shape of the module section 10, more specifically, the shape of the back surface of the module section 10.

The opening 22 is filled with grease (the grease portion 22a) having a Young's modulus (Young's modulus Y2), which is lower than that of the frame 21 (Young's modulus Y1), excluding the space portion 22b.

Further, the space portion 22b is formed at the peripheral edge of the end portion of the frame 21 on the opposite side (upper side) from the gravity direction when the semiconductor module 100 is vertically placed. In the example of FIG. 3B, the space portion 22b is provided in contact with the upper side L1 of the frame 21 and is uninterruptedly provided in a belt shape from one end to the other end of the upper side L1 in the lateral direction. If the frame is polygonal, then the space portion 22b may be provided so as to be in contact with at least one side in the lateral direction.

FIG. 3A and FIG. 3B illustrate the case of placement in which the longitudinal direction and the gravity direction of the semiconductor module 100 are parallel to each other; however, the same applies to the case where the lateral direction and the gravity direction are parallel to each other. More specifically, the space portion 22b can be provided on the side opposite from the gravity direction.

A description will now be given of a part (the portion along cross-sectional line VA-VA) that includes the semiconductor chips 1, the grease portion 22a, and the space portion 22b in FIG. 3B. When viewed from above (when viewed through), the semiconductor chip 1a is placed so as to be separated from the end of the grease portion 22a adjacent to the space portion 22b toward the center of the grease portion 22a (the details of which will be described later). With this placement, the grease portion 22a exists so as to overlap the semiconductor chip 1a, and the semiconductor chip 1a and the space portion 22b are separated from each other and have a non-overlapping positional relationship. Preferably, the grease portion 22a exists under the semiconductor chip 1a and the space portion 22b does not exist thereunder. Consequently, when the module section 10 is pressed toward the cooler 30 or the cooler 30 is pressed toward the semiconductor chip 1a, causing the grease to be compressed, pressed and spread, excess grease can be accommodated in the space portion 22b.

Referring to FIG. 3A, the lower end of the space portion 22b is located above the upper ends of the semiconductor chips 1. Further, the space portion 22b is not located below the semiconductor chips 1 (refer to FIG. 1), and it is required that the grease portion 22a be constantly placed. The heat generated at the semiconductor chips 1 is transferred through the multilayer substrates 5 placed below the semiconductor chips 1 and dissipated by the cooler 30 via the grease portion 22a. The downside in FIG. 3A and FIG. 3B is the gravity direction, and the upside is the direction opposite from the gravity direction.

Referring to FIG. 3A, the upper end of the multilayer substrate 5, e.g., the upper end of the insulating substrate 52, is also preferably placed below the lower end of the space portion 22b. Further, when viewed from above (when viewed through), the second electrically conductive plate 53 of the multilayer substrate 5 is preferably placed so as not to overlap with (not to be exposed to) the space portion 22b.

The Young's modulus Y1 of the frame 21 preferably satisfies a condition of 5 GPa≤Y1≤15 GPa, and the Young's modulus Y2 of the grease portion 22a preferably satisfies a condition of 1 Pa≤Y2≤200 Pa. Any grease may be used as long as viscosity G thereof satisfies a condition of 60 Pa·s≤G≤500 Pa·s in an environment of 25° C. By ensuring that the frame 21 and the grease portion 22a satisfy the aforesaid conditions, when the heat conduction section 20 (frame 21) is pressed and deformed or when the semiconductor chips 1 are warped, the heat generated at the semiconductor chips 1 can be reliably conducted to the cooler 30 by adapting to the deformation or warpage.

The configuration of the heat conduction section 20 described can prevent the grease from sagging. The deformation of the module section 10 causes the grease to temporarily move into the space portion 22b. Thereafter, however, the grease gradually moves back to the original position thereof by gravity (its own weight), so that the problem of pump-out will not arise. These measures make it possible to provide the heat conduction section 20 that suppresses the outflow and pump-out of grease and also suppresses an increase in thermal resistance.

Referring now to FIG. 4, the manufacturing method of the semiconductor module 100 in accordance with the present invention will be briefly described.

First, the material of the heat conduction section 20 is processed into a frame shape (STEP10). For example, a carbon sheet is processed into a frame shape having the opening 22 that is large enough for the plurality of semiconductor chips 1 to be placed therein. In addition, the holes for screws or other fasteners are formed in the material. The carbon sheet further preferably has a thickness of approximately 300 μm to approximately 500 μm, high flexibility, and exhibits thermal conductivity that is approximately the same as that of Cu (400 W/mk) (refer to FIG. 3B).

Next, grease is applied to the lower surface of the module section 10 (STEP20). More specifically, a dedicated mask is used to apply the grease at a predetermined position of the module section 10.

Next, the heat conduction section 20 (the frame 21) is placed on the lower surface of the module section 10 (STEP30). At this time, an adjustment is made such that the grease is placed in the opening 22, The space portion 22b should occupy an area of 5 to 10% of the opening 22. This enables the space portion 22b to adequately accommodate grease that has moved.

Next, the module section 10 in which the heat conduction section 20 (with grease) has been placed is placed on the cooling surface of the cooler 30 (STEP 40). Lastly, the module section 10, the heat conduction section 20, and the cooler 30 are fastened with screws 9 (STEP 50). At this time, the grease and the heat conduction section 20 are slightly deformed according to a joint surface. The thickness of the heat conduction section 20 is approximately 20 μm to approximately 100 μm. Thus, the semiconductor module 100 in accordance with the present invention as illustrated in FIG. 1 is completed.

Figure 5A:
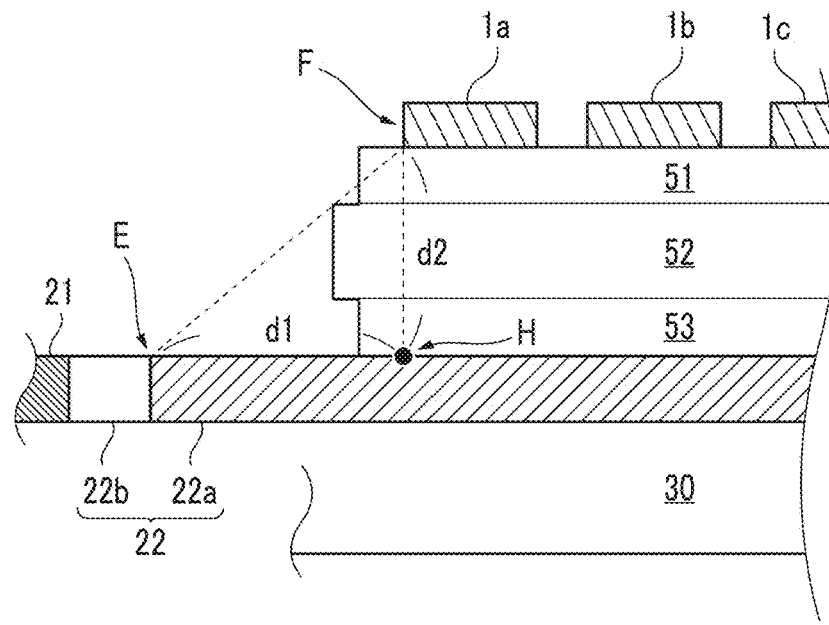
FIG. 5A is a sectional view of the heat conduction section in FIG. 3B taken along VA-VA.

The following will describe a preferred form of the semiconductor module 100. FIG. 5A is a sectional view of the heat conduction section 20 of FIG. 3B taken along VA-VA.

As illustrated in FIG. 5A, the end of the grease portion 22a adjacent to the space portion 22b is denoted as E. Further, the end of the semiconductor chip 1a closer to the end E is denoted as F, and the intersection point of the perpendicular line, which is drawn from the end F down to the grease portion 22a, and the grease portion 22a is denoted as point H. In this case, a distance EH is denoted as d1 (the separation distance between the semiconductor chip 1a and the space portion 22b), and a distance FH is denoted as d2.

In order to efficiently conduct the heat generated at the semiconductor chip 1a to the cooler 30, it is necessary to place at least the semiconductor chip 1a away from the end E of the grease portion 22a toward the center of the grease portion 22a (rightward in the drawing) when viewed from above (d1≠0). This is because the space portion 22b has no effect of conducting heat. Preferably, the position of the end F of the semiconductor chip 1a is determined such that ∠EFH is larger than 45 degrees, taking the nature of heat conduction into account. In other words, the amount of grease should be determined or the semiconductor chip 1a should be placed such that the distance d1 is equal to or larger than the distance d2. From the viewpoint of heat dissipation, it is further preferable that the entire back surface of the second electrically conductive plate 53 of the multilayer substrate 5 is in contact with the grease portion 22a and is not exposed to the space portion 22b.

Figure 5B:
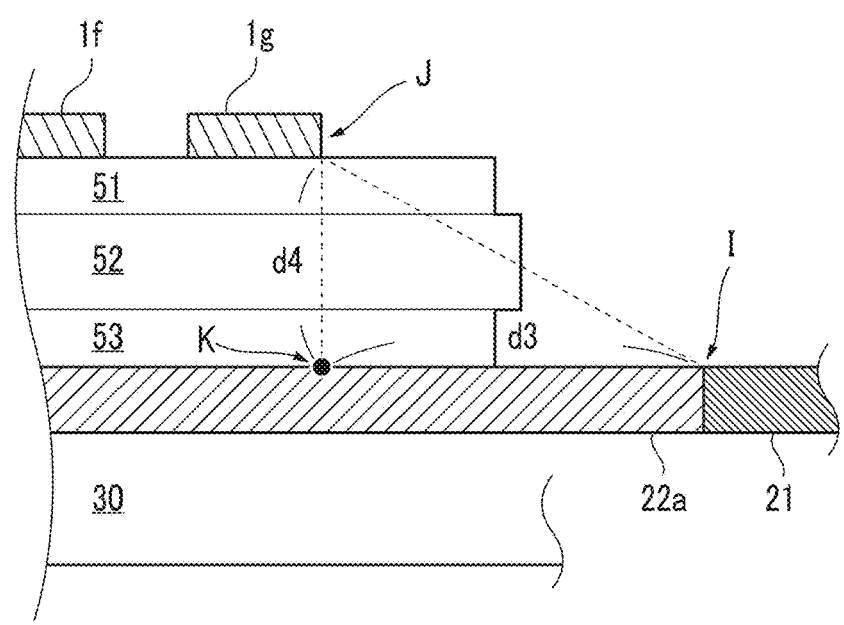
FIG. 5B is a sectional view of the heat conduction section in FIG. 3B taken along VB-VB.

FIG. 5B is a sectional view of the heat conduction section 20 of FIG. 3B taken along VB-VB. As illustrated in FIG. 5B, the end of the grease portion 22a adjacent to the frame 21 is denoted as I. Further, the end of the semiconductor chip 1g closer to the end I is denoted as J, and the intersection point of the perpendicular line, which is drawn from the end J down to the grease portion 22a, and the grease portion 22a is denoted as point K. In this case, a distance IK is denoted as d3 (the separation distance between the semiconductor chip 1g and the end of the grease portion 22a (the end where the space portion 22b is absent), and a distance IK is denoted as d4.

As with the section along VA-VA, in order o efficiently conduct the heat generated at the semiconductor chip 1g to the cooler 30, it is necessary to place at least the semiconductor chip 1g away from the end I of the grease portion 22a toward the center of the grease portion 22a (leftward in the drawing) when viewed from above (d3≠0). This is because the grease portion 22a has higher heat conducting effect than the frame 21. Preferably, the position of the end J of the semiconductor chip 1g is determined such that ∠IJH is larger than 45 degrees. In other words, the semiconductor chip 1g should be placed such that the distance d3 is equal to or larger than the distance d4.

In FIG. 5A and FIG. 5B, the end of the opening 22 in the longitudinal direction has been described with reference to the sectional views. The same applied to the end in the lateral direction in the case where the semiconductor module is installed in an inverter controller such that the lateral direction of the module section 10 is the gravity direction. For example, when the distance from the end of the semiconductor chip 1g in the lateral direction to the end (the closer end) of the space portion 22b in the lateral direction is denoted as d5, the distance d5 is preferably set to be equal to or larger than the distance d2 or d4.

Lastly, a modified form of the heat conduction section of the semiconductor module 100 will be described with reference to FIG. 6.

When viewed from above, a heat conduction section 25 has a comb-shaped portion 23, which protrudes toward a grease portion 22a from the peripheral edge of an opening 22 on the side where a space portion 22b is provided. In the comb-shaped portion 23, the portion that is positioned under a multilayer substrate 5 is indicated by dotted lines.

The comb-shaped portion 23 is provided with a slit portion and placed so as to cover a part of the grease portion 22a and the top of the space portion 22b. Consequently, when the cooler 30 is pressed toward the semiconductor chip 1a, causing the grease to be pushed and spread, the grease moves along the gaps (the slit portion) of the comb-shaped portion 23.

As illustrated in FIG. 3A, preferably, the space portion 22b does not exist on the left side of the semiconductor chip 1a and the grease portion 22a is constantly placed on the left side of the semiconductor chip 1a when the semiconductor module 100 is viewed from the sectional direction. Therefore, the lower end of the slit portion is preferably placed above the semiconductor chip 1a in FIG. 6.

Figure 6:
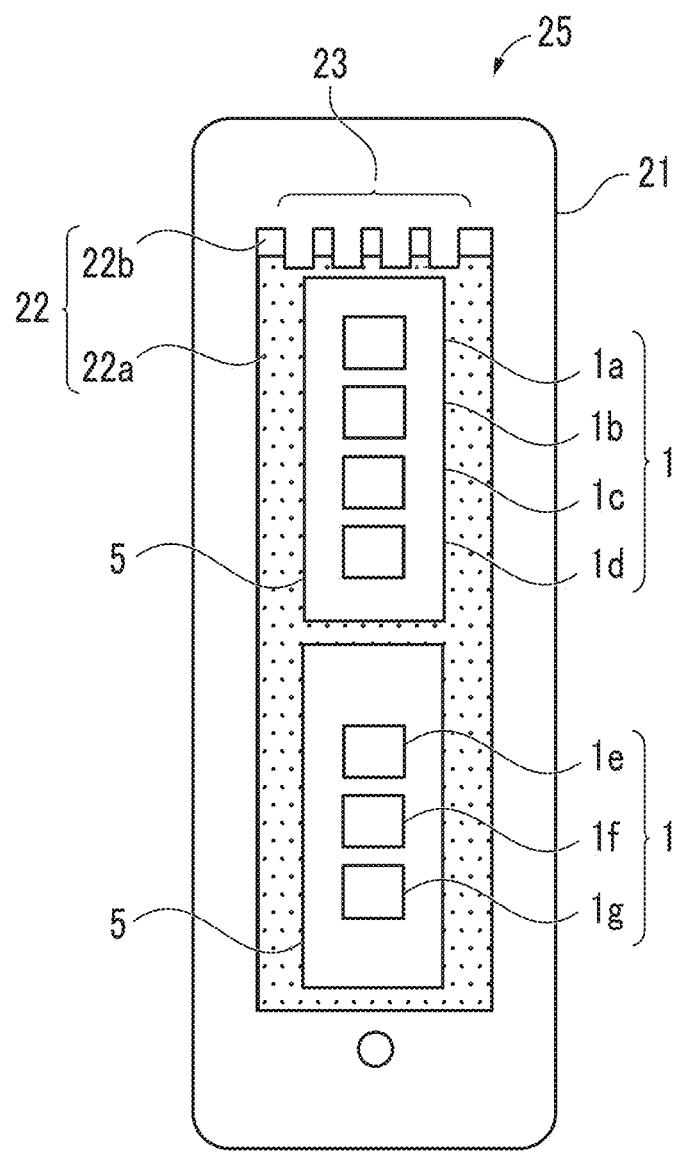
FIG. 6 is a diagram illustrating a modified form of the heat conduction section of the semiconductor module.

Further, the lower end of the slit portion is preferably placed above a second electrically conductive plate 53 in FIG. 6. The lower end of the slit portion is further preferably placed above the upper of the multilayer substrate 5 in FIG. 6.

The presence of the comb-shaped portion 23 provides narrow slits, and the grease smoothly moves through the slits, thus making the grease movement uniform. This makes it less likely for the grease to flow outside, and makes it possible to suppress pump-out. Preferably, the space portion 22b including the slit portion of the comb-shaped portion 23 occupies an area of 5 to 10% of the opening 22.

Although the embodiment for carrying out the present invention has been described above, the present invention is not limited to the aforesaid embodiment, and the embodiment can be modified as necessary within a scope which does not deviate from the gist of the present invention.

In the embodiment described above, the space portion 22b of the heat conduction section 20 exists on the upper side when the semiconductor module 100 is vertically placed; however, the present invention is not limited thereto. For example, if the direction in which the semiconductor chips 1 warp is known in advance, then the space portion may be provided in a belt shape in a part of the peripheral edge of the opening 22 in the warpage direction.

DESCRIPTION OF REFERENCE NUMERALS 1, 1a to 1g: semiconductor chip
2: wiring board
4: pin
5: multilayer substrate
8: case
9: screw
10: module section
11: resin portion
20, 25: heat conduction section
21: frame
22: opening
22a: grease portion
22b: space portion
23: comb-shaped portion
24: air layer
30: cooler
51: first electrically conductive plate
52: insulating substrate
53: second electrically conductive plate
100: semiconductor module

What is claimed is:

1. A semiconductor module comprising:
a multilayer substrate provided with a semiconductor element;
a cooler that cools the multilayer substrate; and
a heat conduction section provided between the multilayer substrate and the cooler,
wherein the heat conduction section includes a frame and an opening, and
the frame is arranged only at a position lower than the multilayer substrate, and the opening has a grease portion which is provided partly in the opening and fills in between the multilayer substrate and the cooler, and a space portion provided between the grease portion and the frame in a partial and band-shaped manner.

2. The semiconductor module according to claim 1, wherein the opening has two sides opposed to each other, and
the space portion is in contact with one of the two sides and is provided from one end to the other end of the one of the two sides.

3. The semiconductor module according to claim 1, wherein the semiconductor element is placed so as to be separated from an end of the grease portion adjacent to the space portion toward a center of the grease portion when viewed from above.

4. The semiconductor module according to claim 1, wherein the space portion occupies an area of 5 to 10% of the opening.

5. A semiconductor module comprising:
a multilayer substrate provided with a semiconductor element;
a cooler that cools the multilayer substrate; and
a heat conduction section provided between the multilayer substrate and the cooler,
wherein the heat conduction section includes a frame and an opening,
the opening has a grease portion which is provided partly in the opening and fills in between the multilayer substrate and the cooler, and a space portion provided between the grease portion and the frame in a partial and band-shaped manner, and the frame is provided with a comb-shaped portion protruding toward the grease portion from a peripheral edge of the opening on a side where the space portion is provided.

6. The semiconductor module according to claim 1, wherein a Young's modulus Y1 of the frame is higher than a Young's modulus Y2 of the grease portion.

7. The semiconductor module according to claim 6, wherein the Young's modulus Y1 satisfies a condition of 5 GPa≤Y1≤15 GPa.

8. The semiconductor module according to claim 6, wherein the Young's modulus Y2 satisfies a condition of 1 Pa≤Y2≤200 Pa.

9. The semiconductor module according to claim 1, wherein viscosity G of the grease portion satisfies a condition of 60 Pa·s≤G≤500 Pa·s.

10. A power conversion device comprising:
the semiconductor module according to claim 1 vertically installed to locate the space portion at a top thereof.

11. The semiconductor module according to claim 1, wherein the grease portion is arranged inside the frame and is partly in contact with the frame.

12. The semiconductor module according to claim 1, wherein the frame is surrounded around the opening, and the grease portion and the space are arranged adjacent to each other in the opening, the grease portion continuously extends between one side of the frame and the opening and has a length in a longitudinal direction longer than that of the multilayer substrate.

13. The semiconductor module according to claim 12, further comprising a case in which the multilayer substrate provided with the semiconductor element is stored, wherein the heat conduction section is arranged between the case and the cooler.

* * * * *

UNITED STATES PATENT AND TRADEMARK OFFICE
CERTIFICATE OF CORRECTION

| | | |
|---|---|---|
| PATENT NO. | : 12,029,017 B2 | |
| APPLICATION NO. | : 17/365053 | |
| DATED | : July 2, 2024 | |
| INVENTOR(S) | : Ryoichi Kato | |

It is certified that error appears in the above-identified patent and that said Letters Patent is hereby corrected as shown below:

On the Title Page

Please change, the item (73) Assignee, from "FUJI ELECTRIC CO., Ltd." to --FUJI ELECTRIC CO., LTD.--.

Signed and Sealed this
First Day of April, 2025

Coke Morgan Stewart
*Acting Director of the United States Patent and Trademark Office*